US006958291B2

(12) United States Patent
Yu et al.

(10) Patent No.: US 6,958,291 B2
(45) Date of Patent: Oct. 25, 2005

(54) INTERCONNECT WITH COMPOSITE BARRIER LAYERS AND METHOD FOR FABRICATING THE SAME

(75) Inventors: Chen-Hua Yu, Koelung (TW); Horng-Huei Tseng, Hsinchu (TW); Syun-Ming Jang, Hsinchu (TW); Chenming Hu, Alamo, CA (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/654,757

(22) Filed: Sep. 4, 2003

(65) Prior Publication Data

US 2005/0054191 A1 Mar. 10, 2005

(51) Int. Cl.[7] ........................................... H01L 21/4763

(52) U.S. Cl. ....................... 438/637; 438/622; 438/627; 438/653; 438/672; 438/675

(58) Field of Search ................................ 438/622, 626, 438/627, 628, 633, 634, 637–640, 653, 672–675, 678, 685–688

(56) References Cited

U.S. PATENT DOCUMENTS

| | | | | |
|---|---|---|---|---|
| 6,607,976 B2 * | 8/2003 | Chen et al. | ................. | 438/627 |
| 6,720,248 B2 * | 4/2004 | Ryo | ........................... | 438/622 |
| 6,841,466 B1 * | 1/2005 | Yu et al. | ..................... | 438/622 |
| 6,849,298 B2 * | 2/2005 | Pyo | ............................ | 427/250 |

* cited by examiner

*Primary Examiner*—Kevin M. Picardat
(74) *Attorney, Agent, or Firm*—Thomas, Kayden, Horstemeyer & Risley LLP

(57) ABSTRACT

Composite ALD-formed diffusion barrier layers. In a preferred embodiment, a composite conductive layer is composed of a diffusion barrier layer and/or a low-resistivity metal layer formed by atomic layer deposition (ALD) lining a damascene opening in dielectrics, serving as diffusion blocking and/or adhesion improvement. The preferred composite diffusion barrier layers are dual titanium nitride layers or dual tantalum nitride layers, triply laminar of tantalum, tantalum nitride and tantalum-rich nitride, or tantalum, tantalum nitride and tantalum, formed sequentially on the opening by way of ALD.

37 Claims, 5 Drawing Sheets

INTERCONNECT WITH COMPOSITE BARRIER LAYERS AND METHOD FOR FABRICATING THE SAME

BACKGROUND OF THE INVENTION

1. Field of the Invention

The present invention relates to semiconductor fabrication, and in particular to copper interconnects with improved diffusion barrier and adhesion between conductors and dielectrics, and methods for fabricating the same.

2. Description of the Related Art

Aluminum and aluminum alloys were the most widely used interconnection metallurgies for integrated circuits. However, it has become more and more important that metal conductors that form the interconnections between devices as well as between circuits in a semiconductor have low resistivity for faster signal propagation. Copper is preferred for its low resistivity as well as for resistance to electromigration (EM) and stress voiding properties for very and ultra large scale integrated (VLSI and ULSI) circuits.

Conventionally, copper interconnects are formed using a so-called "damascene" or "dual-damascene" fabrication process instead of conventional aluminum interconnects. Briefly, a damascene metallization process forms conductive interconnects by deposition of conductive metals, i.e. copper or copper alloy, in via holes or trenches formed in a semiconductor wafer surface. However, copper implementation suffers from high diffusivity in common insulating materials such as silicon oxide, and oxygen-containing polymers, which causes corrosion of the copper with the attendant serious problems of loss of adhesion, delamination, voids, and consequently electric failure of circuitry. A copper diffusion barrier is therefore required for copper interconnects.

Currently, semiconductor devices (e.g., transistors) or conductive elements formed in a semiconductor substrate are typically covered with insulating materials, such as oxides. Selected regions of the oxide layer are removed and therefore create openings in the semiconductor substrate surface. A barrier layer is formed, lining the bottom and sidewalls of the openings for diffusion blocking and as an adhesion interface. A conductive seed layer, e.g. copper seed layer, is then formed upon the barrier layer. The seed layer provides a conductive foundation for a subsequently formed bulk copper interconnect layer typically formed by electroplating. After the bulk copper has been deposited excess copper is removed using, for example, chemical-mechanical polishing. The surface is then cleaned and sealed with a passivation layer or the like. Similar processes will be repeated to construct multi-level interconnects.

Currently, barrier materials, e.g. tantalum nitride, are deposited over an etched substrate using physical vapor deposition (PVD) or chemical vapor deposition (CVD) techniques. Barrier layer deposition by PVD has the advantage of creating barrier layer films of high purity and uniform chemical composition. The drawback of PVD techniques is the difficulty in obtaining good step coverage (a layer which evenly covers the underlying substrate is said to have good step coverage).

In order to further improve circuit performance, low dielectric constant (low-k) materials have been incorporated into the dielectric layers of modern integrated circuits to provide a lower capacitance than conventional silicon oxide and consequently, an increase in circuit speed. Common low-k dielectric materials include SOGs (spin-on-glasses) that are formed from alcohol soluble siloxanes or silicates which are spin-deposited and baked to form a relatively porous silicon oxide structure. Other porous silica structures such as xerogels have been developed, notably by Texas Instruments Inc. and incorporated into dual damascene processes to obtain dielectric layers with dielectric constants as low as 1.3. This is to be compared with a dielectric constant of about 4 for conventional silicon oxide.

Organic and quasi-organic materials such as polysilsesquioxanes, fluorinated silica glass (FSG) and fluorinated polyarylene ethers have been utilized as low-k and ultra low-k dielectric materials. Totally organic, non-silicaceous, materials such as the fluorinated polyarylene ethers, are used increasingly in semiconductor processing technology due to their favorable dielectric characteristics and ease of application. Organosilicate glass (OSGs), for example Black Diamond.™, from Applied Materials Corporation of Santa Clara Calif., has dielectric constants as low as 2.6–2.8.

It is also found that TaN barrier films deposited directly onto certain low-k dielectric materials, in particular, fluorinated low-k materials such as FSGs and OSGs such as Black Diamond, exhibit poor adhesion. This results in delamination of the barrier material, either immediately after deposition or during subsequent processing. Delamination occurs due to by high tensile stresses as well as weak bonding between TaN barrier layers and low-k dielectric layers.

In addition to the requirements of the barrier mentioned above regarding the effectiveness against copper out diffusion, good coverage, good adhesion, barrier films must also be conformal, continuous, and as thin as possible to lower resistivity.

SUMMARY OF THE INVENTION

One object of the present invention is to provide a barrier layer with better adhesion to low-k dielectric layers.

Another object of the present invention is to provide a barrier layer with good step coverage, thereby reducing electromigration (EM).

Still another object of the present invention is to provide a conformal, continuous, thin and low resistivity conductive layer as the interface between the copper seed layer and the low-k dielectric layer for adhesion and diffusion barrier.

To achieve the previously mentioned objects, various composite diffusion barriers are implemented in interconnect structures according to the present invention. In this specification, the expression "composite" denotes a laminated layer and each sub-layer of the laminated layer can be of the same or different material.

Generally in interconnect structure includes: a semiconductor substrate with a contact region thereon; a dielectric layer overlying the semiconductor substrate with an opening exposing the contact region; a diffusion barrier layer and/or an adhesion layer lining the sidewalls of the opening; and a conductor substantially filling the opening. In a preferred embodiment, diffusion barrier is a composite conductive layers formed by atomic layer deposition (ALD) lining the damascene openings in the dielectric, serving as a diffusion barrier and/or adhesion interface.

The preferred composite diffusion barrier layers are laminarly dual titanium nitride layers or dual tantalum nitride layers, triply laminar of tantalum, tantalum nitride and tantalum-rich nitride, or tantalum, tantalum nitride and tantalum, formed sequentially on the dielectric layer by ALD. The preferred thickness of the composite diffusion barrier layer is from 30 to 300 Å.

In a more preferred embodiment, a low-resistivity metal layer, such as titanium or tantalum, is deposited, lining the damascene openings before the formation of the composite diffusion barrier layer.

The advantages of ALD, i.e. ALCVD, are low process temperature and ultra thin film deposition with excellent thickness control. The ALD-formed dually-or triply-laminar diffusion barrier layers have low impurity content, and offer superior uniformity, step coverage, and very low pin-hole densities. Thus, the composite diffusion barrier layers formed by ALD according to the invention exhibit good adhesion, step coverage and low contact resistivity between dielectrics and conductors.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 1 to 7 are cross-sections of an interconnect fabrication according to the first embodiment of the present invention;

DETAILED DESCRIPTION OF THE INVENTION

The following embodiments illustrate application of the present invention to an interconnect structure with a damascene process at the semiconductor substrate level. For convenience, most of the following embodiments are illustrated by a single damascene process, but are not restricted thereto. Indeed, as will be appreciated by persons skilled in the art, a dual damascene process is also preferred according to the invention.

First Embodiment

Figure 1:
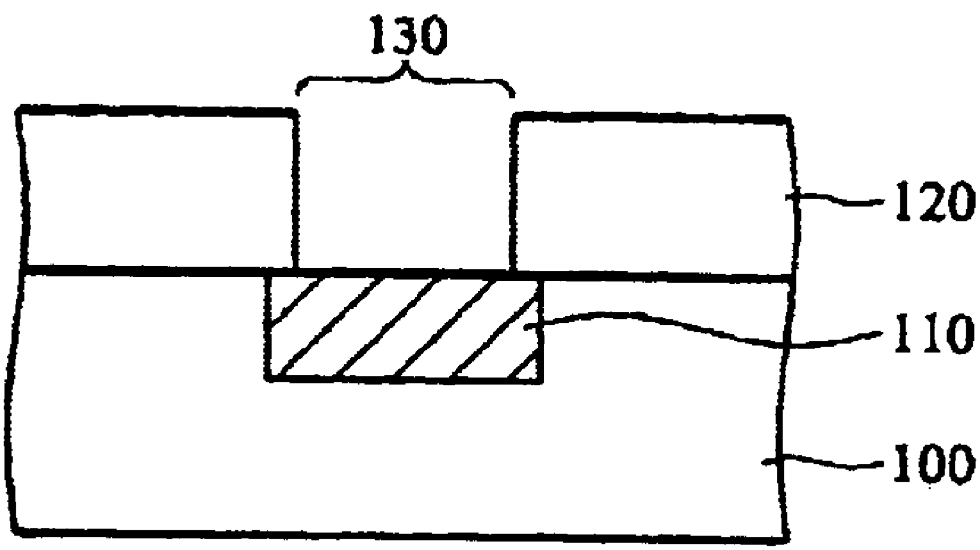

FIG. 1 shows a semiconductor substrate 100 such as a silicon substrate or silicon-on-insulator substrate (SOI). A contact region 110 is formed on the semiconductor substrate 100, such as a conventional MOS contact, interconnects and the like, which can be copper, aluminum, titanium, tantalum, tungsten, an alloy thereof, or a compound thereof.

As shown in FIG. 1, a dielectric layer 120 preferably having a planar upper surface is deposited overlying the substrate 100 and the contact region 110. The dielectric layer 120 is preferably composed of one or more dielectric depositions of silicon-containing or organic-based materials. Preferably, the dielectric layer 120 has a low dielectric constant (k), such as silicon oxide-containing material with a dielectric constant (k) not exceeding 3.5, more preferably 2.8 or below,. The preferred dielectric material is, but not limited to, organosilicate glass, fluorinated silica glass (FSG), organic spin-on glass, inorganic CVD dielectrics, or a combination thereof.

Optionally, an etch-stop layer (not shown) can be formed on the surface of substrate 110 before dielectric deposition. The etch stop layer is preferably a silicon oxynitride or silicon-rich oxynitride layer formed by plasma-enhanced chemical vapor deposition (PE-CVD) using Ar as carrier gas.

A contact opening 130 is then defined and etched in the dielectric layer 120 using conventional lithography technology and etching methods to expose the contact region 110 on the substrate 100. When etching the contact hole 130, the etch-stop layer prevents damage to the underlying contact region 110. The opening 130 can be a via opening or a dual damascene opening, i.e. a combination of a via opening and a trench, depending on the layout of the interconnects. The preferred width of the bottom of the opening 130 is from 100 to 800 Å.

Figure 2A:
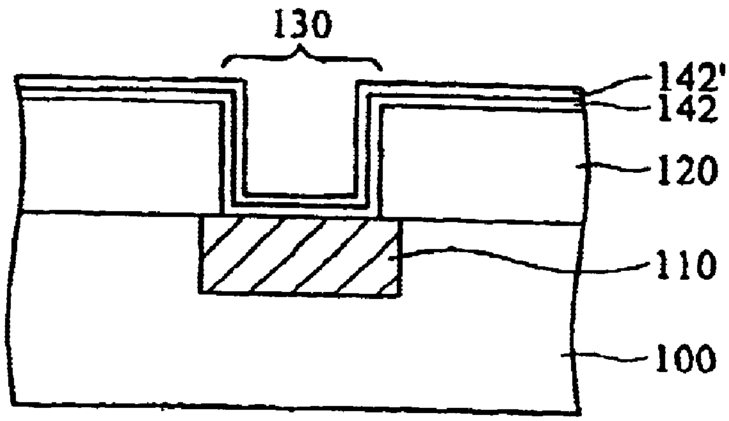
FIGS. 2A to 2C are cross-sections further illustrating the composite diffusion barrier layers according to the present invention.

Before forming a seed layer and filling the opening 130 with conductive material, a composite conductive liner is formed in the opening 130 for diffusion blocking and adhesion. According to the invention, the diffusion barrier layer is formed by atomic layer deposition (ALD). Preferably, as shown in FIG. 2A, diffusion barrier is composed of dual layers. The dual layers can be selected the same or differently from titanium, tantalum, tungsten, titanium nitride, tantalum nitride, amorphous tantalum nitride or amorphous titanium nitride, forming by way of ALD. In a preferred embodiment, the dual layers 142 and 142' are the same conductive material but formed separately. For example, 150 Å of TaN 142 is first deposited, lining the bottom and sidewalls of opening 130 using ALCVD (atomic layer chemical vapor deposition) and then exposed to ambient air or oxygen. In another embodiment, the substrate 100 with 150 Å of TaN 142 can be subjected to hydrogen ambient for plasma treatment. A second TaN layer 142' is subsequently deposited on the first TaN layer with a thickness of 150 Å. In another embodiment, dual TiN layers are formed similarly as the composite diffusion barrier.

Figure 2B:
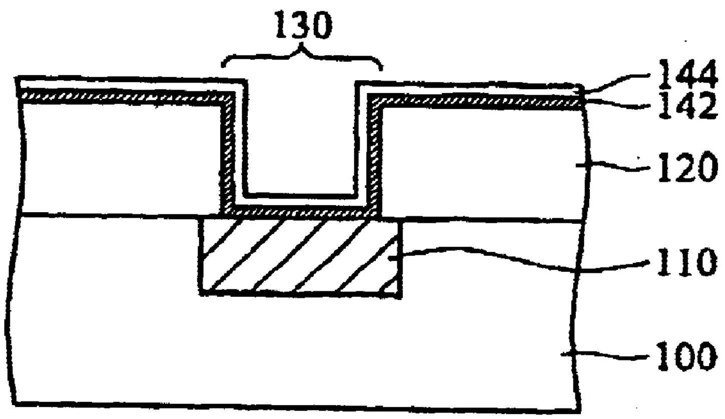

In another embodiment, a low-resistivity conductive layer is further formed before the formation of composite diffusion barrier. As shown in FIG. 2B, a low-resistivity conductive layer 142, such as tantalum metal (Ta) or titanium (Ti), is deposited by ALD with a thickness from 10 to 100 Å, lining the opening 130. A composite diffusion barrier layer 144 is then formed by ALD, lining on the low-resistivity conductive layer 142. Similarly, the composite diffusion barrier layer 144 can be dual or triple layers selected the same or differently from titanium, tantalum, tungsten, titanium nitride, tantalum nitride, amorphous tantalum nitride or amorphous titanium nitride, forming by way of ALD.

Figure 2C:
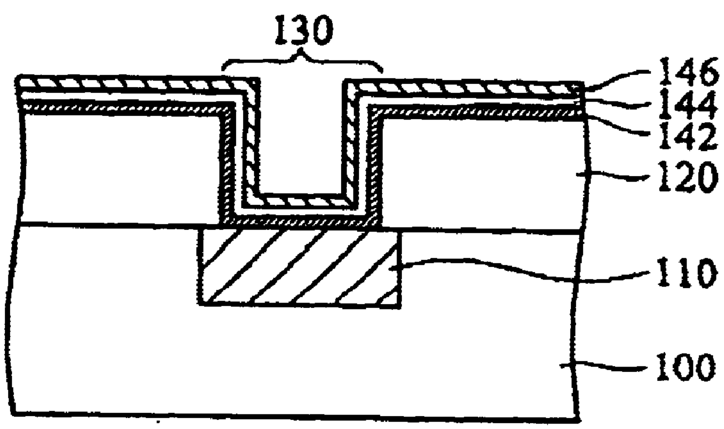

In another preferred embodiment, the composite diffusion barrier layer is laminarly composed of triple layers. As shown in FIG. 2C, low-resistivity tantalum metal (Ta) is deposited lining the opening 130, serving as a first diffusion barrier layer 142. Tantalum nitride (TaN) is then deposited on the tantalum metal layer 142 as a second diffusion barrier layer 144. The preferred third diffusion barrier layer 146 is Ta-rich nitride or tantalum metal. All of the tree diffusion layers 142–146 are formed by way of ALD. The preferred thickness of the triple-composite diffusion barrier layer is from 30 to 300 Å.

One advantage of utilizing a tantalum or titanium metal layer as the first layer lining the opening 130 is to improve the adhesion between the dielectric layer 120, especially for low-k dielectrics, and subsequent copper or copper alloy conductors. Another advantage is the low resistivity of tantalum metal reducing the contact resistivity between conductors.

Figure 3:
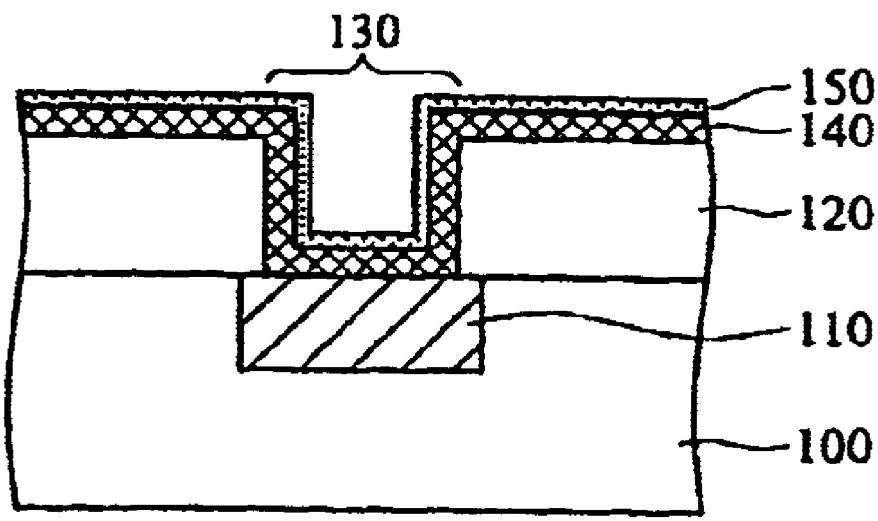

After a composite diffusion barrier layer 140 being formed according to the above methods shown in FIGS. 2A to 2C, a metal seed layer 150 can be optionally deposited on the diffusion barrier layer 140, lining the opening 130, as shown in FIG. 3. The preferred metal seed layer is copper, copper alloy or the combination thereof, deposited by way of conventional PVD, CVD or ALCVD, or wet plating.

Figure 4:
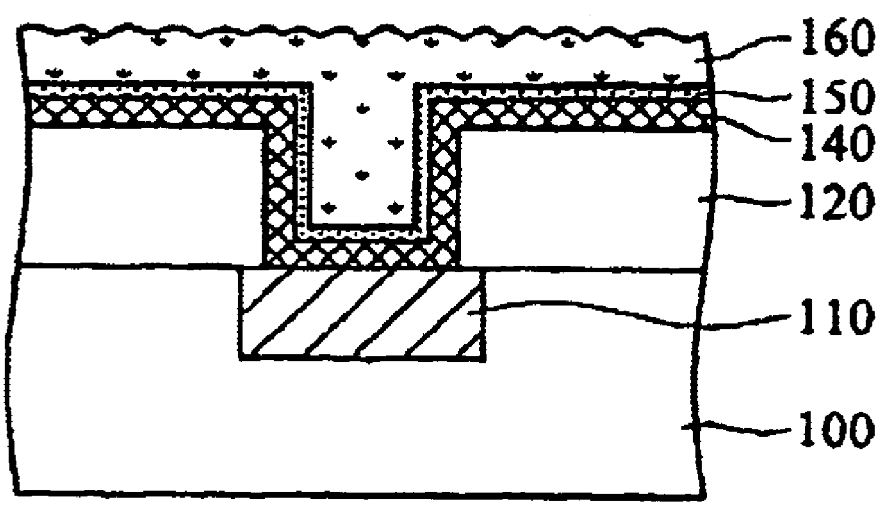
Figure 5:
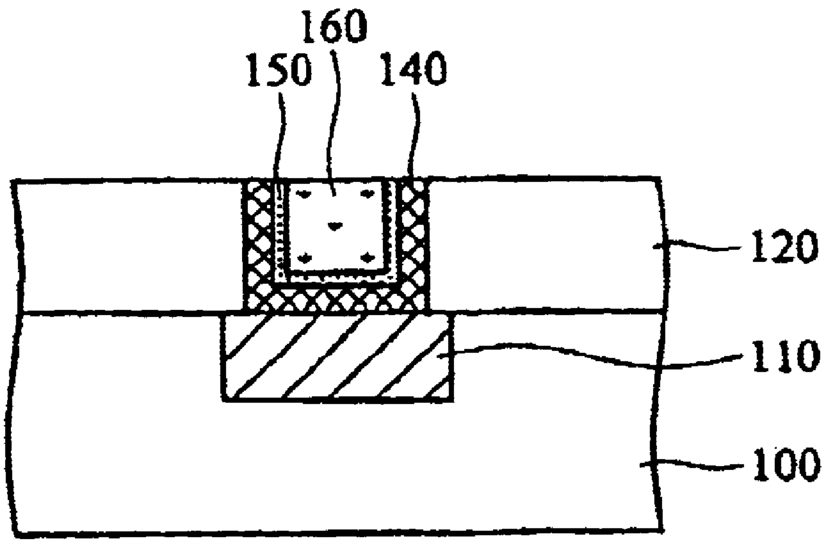

Conductive material 160 is then deposited in the opening 130 as a conductor, electrically connecting the underlying contact region 110 as shown in FIG. 4. Conductive material 160 can be materials including but not limited to metal, metal compounds, metal alloys, doped polysilicon, polycides, although copper and copper alloy are particularly preferred. Copper or copper alloy conductors can be formed by overfilling the opening 130 and removing the conductive material outside of the contact hole by etching back or chemical mechanical polishing (CMP), as shown in FIG. 5. The deposition of copper or copper alloy can be accomplished by chemical vapor deposition (CVD), physical vapor deposition (PVD), or electrochemical deposition (ECD). An annealing process at 150–400° C. can be further performed to reduce the resistivity of the copper or copper alloy conductors.

Figure 6:
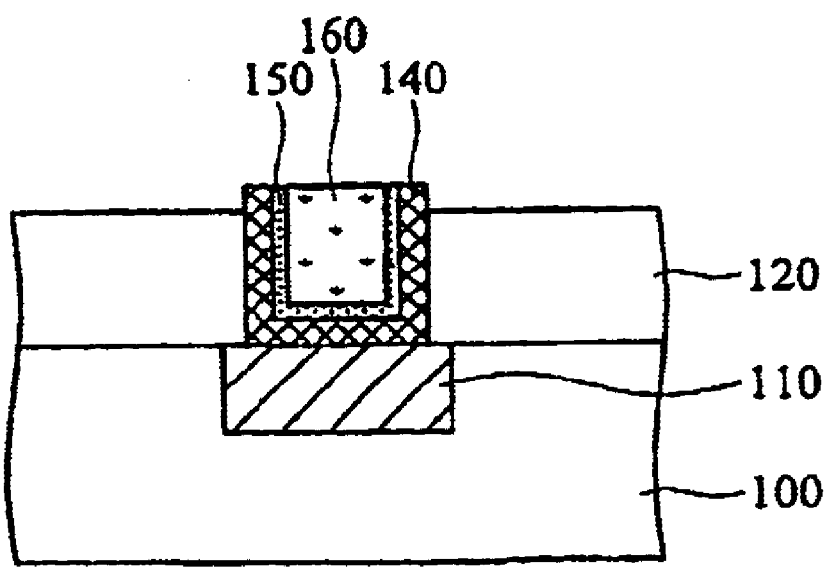

As FIG. 6 shows, in a preferred embodiment, the surface of the dielectric layer 120 is further etched back 100 to 500 Å to expose a portion of the sidewalls of the diffusion barrier layer 140.

Figure 7:
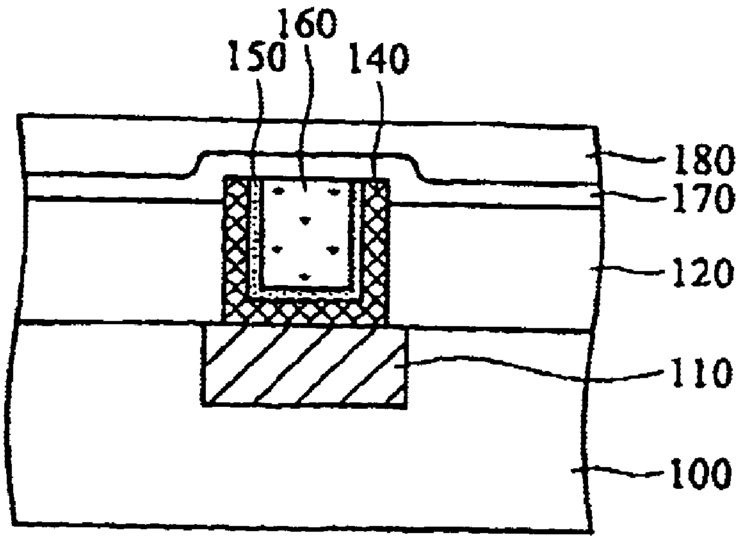

In FIG. 7, a passivation layer 170 and an etch-stop layer 180 are sequentially deposited on the surface of the substrate 100, overlying the dielectric layer 120 and the conductor 160. The preferred passivation layer 170 comprises silicon carbide with carbon content greater than 20%. The preferred etch-stop layer 180 is a carbon-oxygen containing film with a thickness from 500 to 2000 Å and more preferably, 500 to 1000 Å.

In another embodiment, a conductive passivation layer (not shown) can be formed only overlying the second conductor as a capping layer. Preferably, the conductive passivation layer can be formed by self-aligned process.

Second Embodiment

Figure 8:
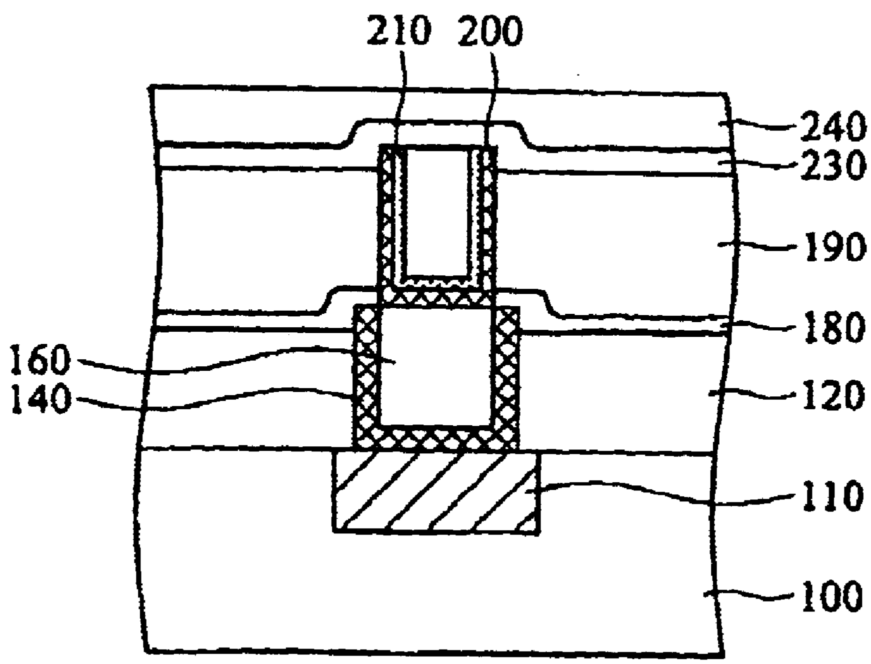
FIG. 8 is a cross-section showing a two-level interconnect structure according to the second embodiment of the present invention.

FIG. 8 illustrates another embodiment of the invention, in which a two-level interconnect is formed by performing similar processes as in the first embodiment. As shown in FIG. 8, a low-k dielectric layer 120, e.g. k≦2.8, is deposited overlying a semiconductor substrate 100 with a first conductor 160 embedded therein. Preferably, a composite diffusion barrier layer 140 is interlaid between the conductor 160 and the first low-k dielectric layer 120, and the surface of the low-k dielectric layer 120 is below the surface of the first conductor 160 approximately 100 to 500 Å. An etch-stop layer 180 and a second low-k dielectric layer 190, e.g. k≦2.8, are deposited sequentially overlying the first dielectric layer 120. A second conductor 220 is embedded in the second low-k dielectric layer 190, connecting the underlying first conductor 160. The preferred width of the second conductor 220 is from 200 to 1000 Å. Preferably, a metal seed layer 210 and a composite diffusion barrier layer 200 are formed by atomic layer deposition (ALD), sequentially covering the bottom and sidewalls of the second conductor 220. More preferably, the surface of the second low-k dielectric layer 190 is lower than the surface of the second conductor 220 by approximately 100 to 500 Å. A passivation layer 230 and an etch-stop layer 240 are sequentially deposited on the surface of the substrate 100, overlying the second low-k dielectric layer 190 and the second conductor 220. As shown in FIG. 8, the preferred passivation layer 230 comprises silicon carbide with carbon content greater than 20%. The preferred etch-stop layer 180 or 240 is a carbon-oxygen containing film with a thickness from 500 to 2000 Å and more preferably, 500 to 1000 Å.

In a preferred embodiment, the first conductor 160 is a tungsten plug connecting a source/drain region, a gate region or a metal silicide of a MOS transistor. The first dielectric layer 120 is phosphorus-doped silicon glass (PSG) un-doped silicon glass (USG), silicon-rich oxide, silicon oxynitride, silicon-rich oxynitride, silicon nitride, silicon-rich nitride, or a combination thereof. The second conductor 220 is a copper, copper alloy, aluminum, or aluminum alloy plug or a dual damascene conductor, and the low-k second dielectric layer can be silicon oxygen-containing material having a dielectric constant (k) less than 2.8, organosilicate glass, fluorinated silica glass (FSG), organic spin-on glass, inorganic CVD dielectrics, or a combination thereof. The dielectric constant (k) of the second low-k dielectric layer 190 is preferably lower than that of the first low-k dielectric layer 120. The first and second diffusion barrier layers 140 and 160 are formed by ALD with a laminar structure as shown in FIG. 2A to 2C.

In another embodiment, the first and second conductors 160 and 220 in FIG. 8 are copper or copper alloy, and both the first and second dielectric layer 120 and 190 are low-k materials, i.e. k≦2.8. More preferably, the dielectric constant k of the second dielectric layer 190 is lower than that of the first dielectric layer 120, thereby improving the stress resistivity of the interconnect structure.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating an interconnect structure, comprising:

providing a semiconductor substrate with a first conductor thereon;

forming a dielectric layer overlying the semiconductor substrate;

forming an opening in the dielectric layer exposing the first conductor;

forming a composite diffusion barrier layer by atomic layer deposition, lining the opening; and filling the opening with a conductive material as a second conductor, electrically connecting the first conductor, wherein the composite diffusion barrier layer is formed by:

forming a first layer of titanium nitride or tantalum nitride;

plasma-treating the first layer of titanium nitride or tantalum nitride in hydrogen ambient;

forming a second layer of titanium nitride or tantalum nitride on the treated first layer.

2. The method as claimed in claim 1, wherein the first conductor is composed of materials from group consisting of copper, copper alloy, aluminum, aluminum alloy, titanium, tantalum, tungsten, metal silicide, metal alloy and a metal compound.

3. The method as claimed in claim 1, wherein the dielectric layer comprises silicon oxide-containing material.

4. The method as claimed in claim 1, wherein the dielectric constant (k) of the dielectric layer is less than 2.8.

5. The method as claimed in claim 1, wherein the width of the opening is from 100 to 800 Å.

6. The method as claimed in claim 1, wherein the thickness of the composite diffusion barrier layer is from 30 to 300 Å.

7. The method as claimed in claim 1, wherein the composite diffusion barrier layer is composed of dual titanium nitride layers or dual tantalum nitride layers.

8. The method as claimed in claim 1, wherein the composite diffusion barrier layer is composed of materials selected from the group consisting of amorphous titanium nitride and amorphous tantalum nitride.

9. The method as claimed in claim 1, wherein the composite diffusion barrier layer comprises tantalum-rich nitride.

10. The method as claimed in claim 9, wherein the composite diffusion barrier layer further comprises a tantalum layer formed on the second layer of tantalum nitride to form a triply laminar of tantalum, tantalum nitride and tantalum-rich nitride.

11. The method as claimed in claim 1, wherein the second conductor is formed of a material selected from the group consisting of copper, copper alloy, aluminum and aluminum alloy.

12. The method as claimed in claim 1, further comprising the step of forming a low-resistivity metal layer having a thickness from 10 to 100 Ålining the bottom and the sidewalls of the opening.

13. The method as claimed in claim 12, wherein the low-resistivity metal layer is formed by self ionized plasma (SIP) sputtering or ionized metal plasma (IMP) sputtering.

14. The method as claimed in claim 12, wherein the low-resistivity metal layer is formed by atomic layer deposition.

15. The method as claimed in claim 12, wherein the low-resistivity metal layer is composed of a material selected from the group consisting of titanium and tantalum.

16. A method for fabricating an interconnect structure, comprising:

providing a semiconductor substrate;

forming a first low-k dielectric layer overlying the semiconductor substrate with a first copper or copper alloy conductor embedded therein;

forming a second low-k dielectric layer overlying the first low-k dielectric layer; forming an opening in the second low-k dielectric layer exposing the first copper or copper alloy conductor;

forming a composite diffusion barrier layer by atomic layer deposition, lining the opening; and forming a second conductor embedded in the opening and electrically connecting the first copper or copper alloy conductor, and the surface of the second low-k dielectric layer is lower than the surface of the second conductor; wherein the second conductor is composed of copper or copper alloy.

17. The method as claimed in claim 16, further comprising a step of forming a passivation layer overlying the second low-k dielectric layer and second conductor.

18. The method as claimed in claim 16, wherein the passivation layer comprises silicon carbide.

19. The method claimed in claim 12, further comprising the step of forming an etch-stop layer overlying the passivation layer.

20. The method as claimed in claim 16, further comprising a step of forming a conductive passivation layer overlying the second conductor.

21. The method as claimed in claim 16, wherein the first low-k dielectric layer comprises silicon oxygen-containing material.

22. The method as claimed in claim 16, wherein the dielectric constant (k) of the first low-k dielectric layer less than 2.8.

23. The method as claimed in claim 16, wherein the second low-k dielectric layer comprises silicon oxygen-containing material.

24. The method as claimed in claim 16, wherein the dielectric constant (k) of the second low-k dielectric layer less than 2.8.

25. The method as claimed in claim 16, wherein the dielectric constant k of the second low-k dielectric layer is lower than that of the first low-k dielectric layer.

26. The method as claimed in claim 16, wherein the width of the second conductor is substantially from 200 to 1000 Å.

27. The method as claimed in claim 16, further comprising the step of: forming a low-resistivity metal layer lining the opening with a thickness from 10 to 100 Åby atomic layer deposition before the formation of the composite diffusion barrier layer.

28. The method as claimed in claim 16, wherein the low-resistivity metal layer is composed of a material selected from the group consisting of titanium and tantalum.

29. The method as claimed in claim 16, wherein the thickness of the composite diffusion barrier layer is from 30 to 300 Å.

30. The method as claimed in claim 16, wherein the composite diffusion barrier layer is composed of dual titanium nitride layers or dual tantalum nitride layers.

31. The method as claimed in claim 30, wherein the dual titanium nitride layers or tantalum nitride layers are formed by the steps of: forming a first layer of titanium nitride or tantalum nitride; plasma-treating the first layer of titanium nitride or tantalum nitride in hydrogen ambient; forming a second layer of titanium nitride or tantalum nitride on the treated first layer.

32. The method as claimed in claim 16, wherein the composite diffusion barrier layer is dually or triply laminar composed of materials selected from the group consisting of titanium, tantalum, tungsten, titanium nitride and tantalum nitride.

33. The method as claimed in claim 16, wherein the composite diffusion barrier layer is composed of materials selected from the group consisting of amorphous titanium nitride and amorphous tantalum nitride.

34. The method as claimed in claim 16, wherein the composite diffusion barrier layer comprises tantalum-rich nitride.

35. The method as claimed in claim 16, wherein the composite diffusion barrier layer is formed as triply laminar of tantalum, tantalum nitride and tantalum-rich nitride.

36. The method as claimed in claim 16, wherein the composite diffusion barrier layer is formed as triply laminar of tantalum, tantalum nitride and tantalum.

37. The method as claimed in claim 16, further comprising the step of etching the surface of the second low-k dielectric layer until below the surface of the second conductor from 100 to 500 Å.

* * * * *